(12) United States Patent
Fujikami et al.

(10) Patent No.: US 6,215,072 B1
(45) Date of Patent: *Apr. 10, 2001

(54) METHOD OF PREPARING AN OXIDE SUPERCONDUCTING CONDUCTOR

(75) Inventors: Jun Fujikami; Nobuhiro Shibuta; Kenichi Sato, all of Osaka; Tsukushi Hara; Hideo Ishii, both of Yokohama, all of (JP)

(73) Assignee: Sumitomo Electric Industries, Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/326,178

(22) Filed: Oct. 19, 1994

(30) Foreign Application Priority Data

Oct. 21, 1993 (JP) .................................................... 5-263381

(51) Int. Cl.[7] .................................................. H01B 12/00
(52) U.S. Cl. ...................... 174/125.1; 29/599; 505/431; 505/887
(58) Field of Search ........................ 174/125.1; 505/230, 505/231, 234, 430, 431, 704, 740, 813, 884, 887, 886; 29/599

(56) References Cited

U.S. PATENT DOCUMENTS

| | | | |
|---|---|---|---|
| 3,838,503 | * 10/1974 | Suenaga et al. | 29/599 |
| 4,377,905 | 3/1983 | Agatsuma et al. | 174/125.1 |
| 5,098,178 | * 3/1992 | Ortabasi | 505/230 |

FOREIGN PATENT DOCUMENTS

| | | |
|---|---|---|
| 1 813 397 | 6/1970 | (DE) . |
| 23 45 779 | 3/1974 | (DE) . |
| 0 285 319 | 10/1988 | (EP) . |
| 0 291 075 | 11/1988 | (EP) . |
| 0 417 329 | 3/1991 | (EP) . |
| 0 449 316 | 10/1991 | (EP) . |
| 0 451 864 | 10/1991 | (EP) . |
| 0 503 535 | 9/1992 | (EP) . |
| 0 504 895 | 9/1992 | (EP) . |
| 0281319 | * 11/1988 | (JP) ..................................... 505/740 |
| 0207419 | * 8/1990 | (JP) ..................................... 505/740 |
| 4-218215 | * 8/1992 | (JP) . |
| 5-101722 | * 4/1993 | (JP) . |
| 5-144332 | * 6/1993 | (JP) . |
| 5-144333 | * 6/1993 | (JP) . |
| 5-151837 | * 6/1993 | (JP) . |

OTHER PUBLICATIONS

Yang et al., "Investigation of the Bending Effect and the Critical Current Density on a Bi–Based Superconducting Tape", 1993, pp. 803–806 with cover.*

Belenky et al., "Effect of Stress Along the ab Plane on the $J_c$ and $T_c$ of $YBa_2Cu_3O_7$ Thin Films," Physical Review B, vol. 44, No. 18, Nov. 1, 1991, pp. 10117–10120.

Bud'ko et al., "Uniaxial Pressure Dependence of the Superconducting Critical Temperature in $RBa_2Cu_3O_7-\delta$ High–$T_c$ Oxides," Physical Review B, vol. 46, No. 2, Jul. 1, 1992, pp. 1257–1260.

(List continued on next page.)

Primary Examiner—Hyung-Sub Sough
(74) Attorney, Agent, or Firm—Pennie & Edmonds LLP

(57) ABSTRACT

Provided is an oxide superconducting conductor consisting of a plurality of metal-covered multifilamentary superconducting wires which are assembled with each other. Bending is applied to the superconducting conductor for improving its critical current density. It is possible to obtain a compact superconducting conductor having higher capacity, since its critical current density is increased by such application of bending.

6 Claims, 2 Drawing Sheets

OTHER PUBLICATIONS

Welp et al., "Effect of Uniaxial Stress on the Superconducting Transition in $YBa_2Cu_3O_7$," Physical Review Letters, vol. 69, No. 14, Oct. 5, 1992, pp. 2130–2133.

Mukai et al., "Bi–Based Silver–Sheathed High–$T_c$ Superconducting Wire and Application," Advances in Superconductivity V (Proc. of the 5$^{th}$ Int. Symp. On Superconductivity), Kobe, Japan, Nov. 16–19, 1992, Springer–Verlag 1993, pp. 679–684.

Fujikami et al., "5m/2kA High–$T_c$ Cable Conductor," Advances in Superconductivity V (Proc. Of the 5$^{th}$ Int. Symp. On Superconductivity), Kobe, Japan, Nov. 16–19, 1992, Springer–Verlag 1993, pp. 1251–1254.

"Patent Abstracts of Japan", vol. 016 No. 441 (E–1264), Sep. 14, 1992 and JP–A–04 155711 (Central Res. Ins. od Electric Power Ind.) May, 28, 1992.

"Applied Physics Letters", Feb. 20, 1989, USA, vol. 54, No. 8, ISSN 0003–6951, pp. 766–768; Sen S. et al. 'Fabrication of stable superconductive wires with $YBa_2Cu_3O_x/Ag_2O$ composite core'.

Sutton, "Induced circumferential currents and losses in flexible superconducting cables", Cryogenics, pp. 541–545, Sep., 1975.

* cited by examiner-

METHOD OF PREPARING AN OXIDE SUPERCONDUCTING CONDUCTOR

BACKGROUND OF THE INVENTION

1. Field of the Invention

The present invention relates to an oxide superconducting conductor, and more particularly, it relates to an oxide superconducting conductor having a high critical current density.

2. Description of the Background Art

In recent years, ceramic superconducting materials, i.e., oxide superconducting materials, exhibiting higher critical temperatures are watched with interest. In particular, yttrium, bismuth and thallium oxide superconducting materials exhibit high critical temperatures of about 90 K, 110 K and 120 K respectively, to remain in superconducting states under temperatures higher than the liquid nitrogen temperature. Thus, such oxide superconducting materials are expected for practical application to high temperature superconducting materials with cooling media of liquid nitrogen.

In relation to practical use of such an oxide superconducting material, study is now being made on application to a superconducting cable which is cooled with liquid nitrogen, for example. When a superconducting cable consisting of an oxide superconducting material is put into practice, it is possible to simplify a thermal protection system and to reduce the cooling cost since this cable requires no cooling with high-priced liquid helium, dissimilarly to a conventional superconducting cable utilizing a metal superconducting conductor.

The inventors have satisfied in development of an oxide superconducting wire which is excellent in bendability by bringing a superconductor into a multifilamentary state with silver, for example, as an exemplary oxide superconducting conductor which is applied to such a superconducting cable. They have discovered that it is possible to obtain a flexible oxide superconducting conductor having a high critical current density by assembling a plurality of such silver-covered superconducting multifilamentary wires on a flexible pipe which serves as a core called a former.

In an oxide superconducting conductor obtained in the aforementioned manner, however, there still remains a room to be improved in view of the critical current density. An oxide superconducting conductor which is applied to a cable or the like must have a higher critical current density.

SUMMARY OF THE INVENTION

An object of the present invention is to provide an oxide superconducting conductor having a higher critical current density and a superconducting cable utilizing the oxide superconducting conductor, thereby solving the aforementioned problem.

According to an aspect of the present invention, provided is an oxide superconducting conductor consisting of a plurality of metal-covered multifilamentary superconducting strands which are assembled with each other. The present invention is characterized in that bending is applied to this superconducting conductor for improving its critical current density.

In general, an oxide superconductor consisting of a ceramic has been recognized as being extremely weak against bending also in a conductor state. Thus, it has been considered indispensable for practicalization of a superconducting cable to implement a superconducting conductor which is resistant against bending and provided with a high critical current density.

Through their particular experiments, the inventors have discovered that it is possible to obtain a flexible oxide superconducting conductor having a high critical current density as described above by assembling a plurality of metal-covered multifilamentary superconducting strands on a former.

In each of these experiments, the inventors temporarily bent the conductor, thereafter returned the same to a linear state and dipped the same in liquid nitrogen, in order to measure the critical current density of the superconducting conductor in a bent state.

On the other hand, the inventors made a new experiment by dipping a conductor which was maintained in a bent state in liquid nitrogen, for measuring its critical current density. In this case, improvement of about 10% was recognized in the critical current density as compared with the value which was measured in a linear state. Namely, the inventors have discovered through this experiment that the critical current density of a superconducting conductor consisting of an oxide superconductor is improved in a bent state as compared with that in a linear state, so long as the superconducting conductor is bendable. The present invention utilizes such an effect.

The superconducting conductor according to the present invention is characterized in that bending is applied to the same. Thus, its critical current density is improved as hereinabove described.

According to the present invention, the bending which is applied to the superconducting conductor is preferably at least 0.5 m in radius of curvature, more preferably at least 1.0 m and not more than 3.0 m in radius of curvature, in order to attain effective improvement of the critical current value.

The metal for covering the multifilamentary superconducting strands which are employed in the present invention is preferably prepared from silver or a silver alloy. The oxide superconductor, which may conceivably be prepared from a bismuth, thallium or yttrium superconductor, is preferably prepared from a bismuth oxide superconductor, in consideration of easiness of elongation, the high critical current density and the like. Further, the filament number of each multifilamentary strand is at least 7 and not more than 10,000.

When wires are spirally wound on the former in the present invention to be assembled with each other, it is preferable to wind the wires in a plurality of layers while reversing winding directions of the layers, in order to improve adhesion between tape-shaped superconducting multifilamentary wires by winding an insulating material. The most conspicuous effect is brought about when DC current is supplied to the super conducting conductor and this will be the most effective means in applying the same to the DC superconducting cable.

Preferably, an insulating material having a coefficient of heat contraction of at least twice that of the superconducting wires is wound on the surface of the superconducting conductor. Thus, the conductor is radially compressed in cooling, whereby adhesion between the superconducting wires is improved for improving the critical current density of the conductor.

According to the present invention, the insulating material which can radially compress the conductor in cooling must have a coefficient of heat contraction of at least twice, preferably at least five times that of the superconducting strands as employed. For example, a silver-covered Bi superconducting multifilamentary wire exhibits a coefficient of heat contraction of about 0.2% when the same is cooled from the room temperature to the liquid nitrogen temperature. Therefore, the insulating material is preferably prepared from a PPLP paper (polypropylene laminate paper), a PE film (polyethylene film), EP rubber (ethylene propylene rubber), a PE solid insulator (polyethylene solid insulator) or the like, which has a coefficient of heat contraction of at least 1%.

According to another aspect of the present invention, provided is an oxide superconducting cable which is formed by stranding a plurality of superconducting conductors. Each of the superconducting conductors consists of a plurality of metal-covered multifilamentary strands which are assembled with each other, while bending is applied thereto for improving its critical current density.

Namely, the superconducting cable according to the present invention is formed by a plurality of superconducting conductors which are stranded with each other. Due to such a stranded structure employed in preparation of the superconducting cable, bending is applied to the conductors for improving the critical current density of the superconducting cable.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Example 1

Figure 1:
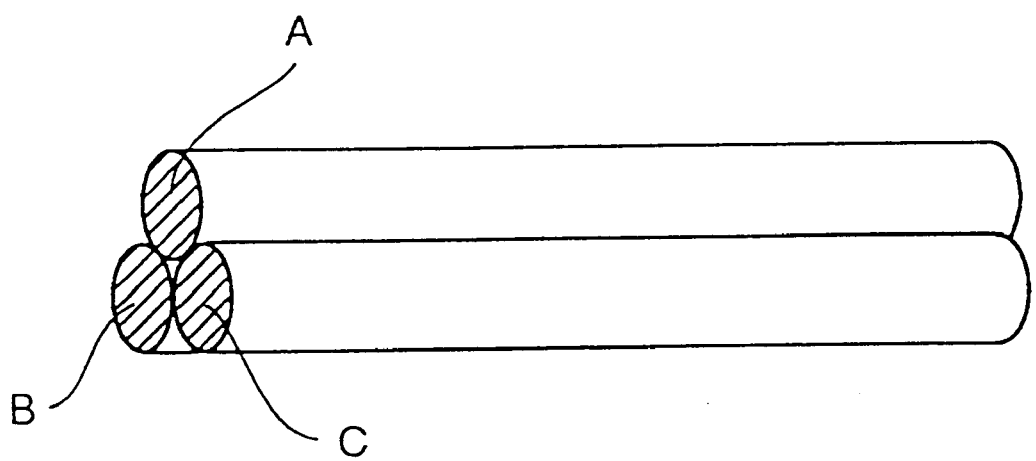
FIG. 1 is a perspective view showing three conductors being approximated to each other.

First, tape-shaped superconducting multifilamentary wires were prepared as superconducting strands, in the following manner:

Oxides and carbonates were mixed with each other to have a composition containing Bi, Pb, Sr, Ca and Cu in ratios of 1.8:0.3:2.0:2.0:3.0, and the mixture was heat treated to prepare powder mainly consisting of a 2212 phase and a non-superconducting phase. This powder was charged in a silver pipe and thereafter drawn to prepare a superconducting single-core wire. 61 such superconducting single-core wires were engaged in a silver pipe, drawn and further rolled to prepare a multifilamentary tape-shaped wire. This wire was heat treated at 845° C. for 50 hours, and thereafter subjected to secondary rolling. Thereafter the wire was secondarily sintered at a sintering temperature of 840° C. for 100 hours.

The tape-shaped superconducting multifilamentary wire obtained in the aforementioned manner exhibited a critical current density of 20,000 A/cm$^2$ in liquid nitrogen over a length of 5 m. When bending was applied to this superconducting multifilamentary wire, no deterioration was caused in the critical current density up to a bending distortion factor of 0.5%.

Further, the critical current density was not increased when the superconducting multifilamentary wire was subjected to bending distortion.

Then, superconducting multifilamentary wires prepared in the aforementioned manner were assembled on a spiral pipe of 1.4 m in length, 19 mmφ in outer diameter and 0.3 mm in thickness provided with grooves of 2 mm in depth and 4 mm in pitch. Before assembling the wires, a silver tape of 50 μm in thickness was spirally wound on the former for covering the grooves, in order to effectively prevent the strands from falling in the grooves upon bending. Then, 75 wires (25 wires by three layers) were spirally wound on the pipe at a winding pitch of 250 mm, while reversing the winding directions every layer. The conductor as obtained had an outer diameter of 21 mm, and exhibited a critical current value of 1,400 A.

Thereafter critical current values were measured with application of various values of bending. The results were as follows:

When bending of 3.0 m in radius of curvature was applied, no obvious change of the critical current value was observed as compared with that measured in the linear state.

When bending of 2.5 m in radius of curvature was applied, improvement of about 3% was observed in the critical current value as compared with that measured in the linear state.

When bending of 1.25 m in radius of curvature was applied, improvement of about 8% was observed in the critical current value as compared with that measured in the linear state.

Bending of up to 0.75 m in radius of curvature was applied as minimum bending. Also in this case, improvement of about 5% was observed in the critical current value as compared with that measured in the linear state.

As to the critical current density, improvement of about 8% at the maximum was obtained by applying bending.

Example 2

The tape-shaped superconducting multifilamentary wires prepared in Example 1 were assembled on a spiral pipe of 5 m in length, 19 mmφ in outer diameter and 0.3 mm in thickness with grooves of 2 mm in depth and 4 mm in pitch. 125 wires (25 wires by 5 layers) were spirally wound on the pipe at a winding pitch of 250 mm, and the winding directions were reversed every layer. The conductor as obtained had an outer diameter of 22 mm.

For the purpose of insulation/protection, a. PPLP paper (polypropylene laminate paper) of 140 μm in thickness and 30 mm in width was then spirally wound on a surface of this conductor over three layers at a pitch 40 mm with gaps of 1 mm. The directions of insulating winding were reversed every layer. The conductor provided with the PPLP paper exhibited a critical current value of 1,800 A and a critical current density of 130,000 A/cm$^2$.

Thereafter the critical current value was measured with application of bending.

When bending of 1.25 m in radius of curvature was applied, the critical current value was improved by about 10% as compared with that measured in the linear state, to reach 2,000 A. The critical current density was 14,000 A/cm$^2$.

Example 3

Three conductors A, B and C were prepared in a similar manner to Example 2.

The three conductors A, B and C were approximated to each other as shown in FIG. 1 to integrally form a superconducting cable in a parallel manner and subjected to an energization test. This superconducting cable exhibited a critical current of 3500 A.

Figure 2:
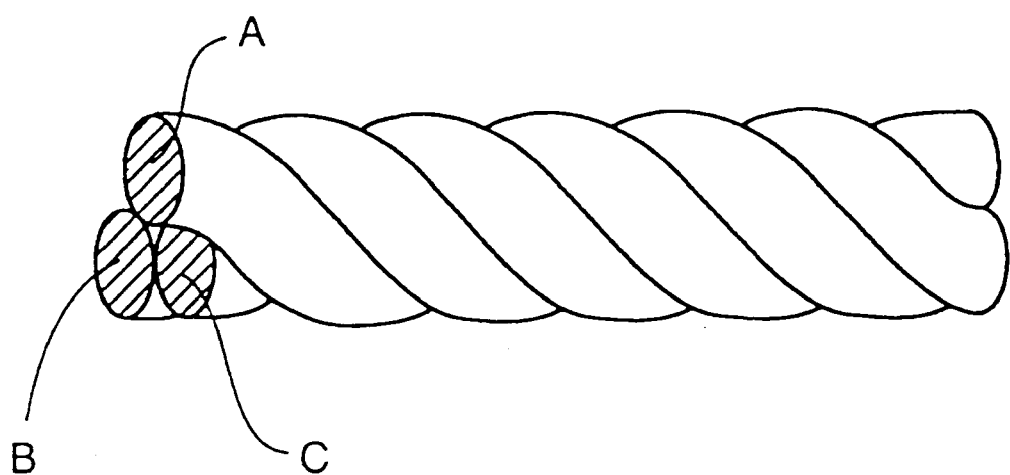
FIG. 2 is a perspective view showing a superconducting cable according to Example of the present invention.

Thereafter the three conductors A, B and C were braided as shown in FIG. 2 to integrally form a superconducting cable, which in turn was energized. In this case, the critical current was improved by about 8%, to reach 3800 A.

Example 4

A superconducting conductor of 5 m in length was prepared with eight winding layers, similarly to Example 2.

Three layers of a PPLP paper were wound on the outermost layer.

This conductor was subjected to measurement of the critical current Ic in a linear state, to exhibit a value of 2750 A.

When bending of 1.3 m in radius of curvature was applied to the conductor in liquid nitrogen, the critical current Ic was improved to 3000 A.

When the conductor was thereafter returned to the linear state, the critical current Ic remained at 3000 A.

Thereafter the conductor was dipped in $LN_2$ with application of bending of 1.3 m in radius of curvature, and subjected to measurement of the critical current. Also in this case, the critical current Ic remained at 3000 A.

Thus, it has been proved possible to attain a sufficient effect of improving the critical current by applying bending to the conductor only once, while the effect is maintained also when the conductor is returned to a linear state.

According to the present invention, as hereinabove described, it is possible to implement a compact superconducting conductor having higher capacity since its critical current density is improved by application of bending.

According to the present invention, further, it is possible to obtain a superconducting conductor which is further improved in critical current density by winding an insulating material on a surface of the conductor.

Figure 3:
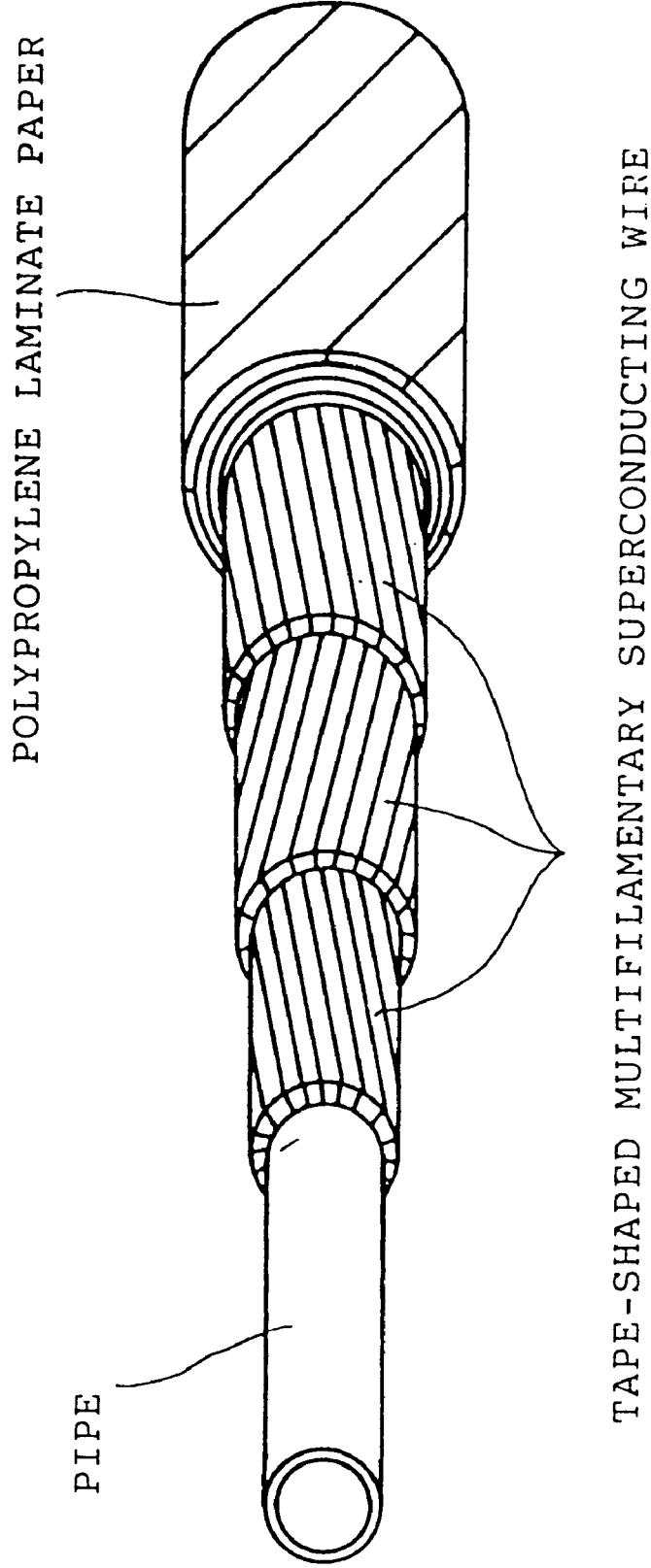
FIG. 3 is a perspective view showing a superconductor having superconducting multifilamentary tape-shaped wires.

According to the present invention, further, it is possible to obtain a superconducting cable having higher capacity than a single-core cable by employing a stranded structure for preparation of the superconducting cable as shown in FIG. 3, since bending is applied to the conductors in structure to increase the critical current density of the cable.

Although the present invention has been described and illustrated in detail, it is clearly understood that the same is by way of illustration and example only And is not to be taken by way of limitation, the spirit and scope of the present invention being limited only by the terms of the appended claims.

What is claimed is:

1. A method of preparing an oxide superconducting conductor comprising the steps of:

providing a core member;

spirally winding a plurality of metal-covered multifilamentary superconducting strands on the core member to form an oxide superconducting conductor;

winding a first insulating material on a surface of the superconducting conductor wherein the first insulating material has a coefficient of heat contraction of at least twice that of the superconducting strands;

bending the oxide superconducting conductor at a constant radius of curvature over the entire length of the superconducting conductor to improve its critical current in both bent and linear states over a same oxide superconducting conductor without the bending;

wherein the bending applied to the superconducting conductor is between 0.5 m and 3.0 m in radius of curvature.

2. The method of claim 1 wherein the bending applied to the superconducting conductor is between 1.0 m and 3.0 m in radius of curvature.

3. The method of claim 1 wherein bending is temporarily applied to the superconducting conductor.

4. The method of claim 1 further comprising the step of maintaining the bending applied to the superconducting conductor, whereby the critical current density of the superconducting conductor increases by 10%.

5. The method of claim 1 wherein the winding step comprises winding the strands in a plurality of layers reversed in their winding directions.

6. The method of claim 5 further comprising the step of winding a second insulating material between the superconducting strand layers.

\* \* \* \* \*